US010020386B1

(12) United States Patent
Singh et al.

(10) Patent No.: US 10,020,386 B1
(45) Date of Patent: Jul. 10, 2018

(54) HIGH-VOLTAGE AND ANALOG BIPOLAR DEVICES

(71) Applicant: GLOBALFOUNDRIES INC., Grand Cayman (KY)

(72) Inventors: Jagar Singh, Clifton Park, NY (US); Baofu Zhu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/454,511

(22) Filed: Mar. 9, 2017

(51) Int. Cl.
*H01L 29/735* (2006.01)
*H01L 27/02* (2006.01)
*H01L 29/06* (2006.01)
*H01L 29/08* (2006.01)
*H01L 29/10* (2006.01)

(52) U.S. Cl.
CPC ........ *H01L 29/735* (2013.01); *H01L 27/0259* (2013.01); *H01L 29/0649* (2013.01); *H01L 29/0804* (2013.01); *H01L 29/0808* (2013.01); *H01L 29/0821* (2013.01); *H01L 29/1004* (2013.01); *H01L 29/1008* (2013.01)

(58) Field of Classification Search
CPC ............. H01L 29/1004; H01L 29/1008; H01L 27/0259; H01L 29/0649; H01L 29/0804; H01L 29/0808; H01L 29/0821; H01L 29/735
See application file for complete search history.

(56) References Cited

U.S. PATENT DOCUMENTS

| 9,177,951 | B2 | 11/2015 | Singh et al. |
| 2002/0135046 | A1 | 9/2002 | Yu |
| 2008/0048296 | A1* | 2/2008 | Lim .................... H01L 27/0664 257/565 |
| 2016/0020204 | A1 | 1/2016 | Singh et al. |

OTHER PUBLICATIONS

Sedra, Adel S. Microelectronic Circuits. New York, Oxford University Press, 1998.*

* cited by examiner

*Primary Examiner* — Fei Fei Yeung Lopez
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to high-voltage, analog bipolar devices and methods of manufacture. The structure includes: a base region formed in a substrate; a collector region formed in the substrate and comprising a deep n-well region and an n-well region; and an emitter region formed in the substrate and comprising a deep n-well region and an n-well region.

18 Claims, 5 Drawing Sheets

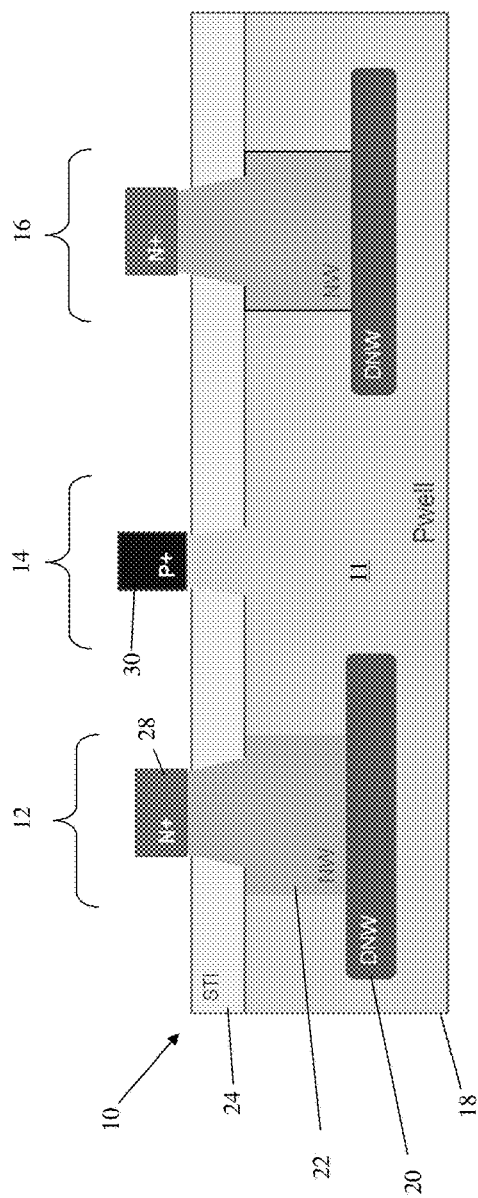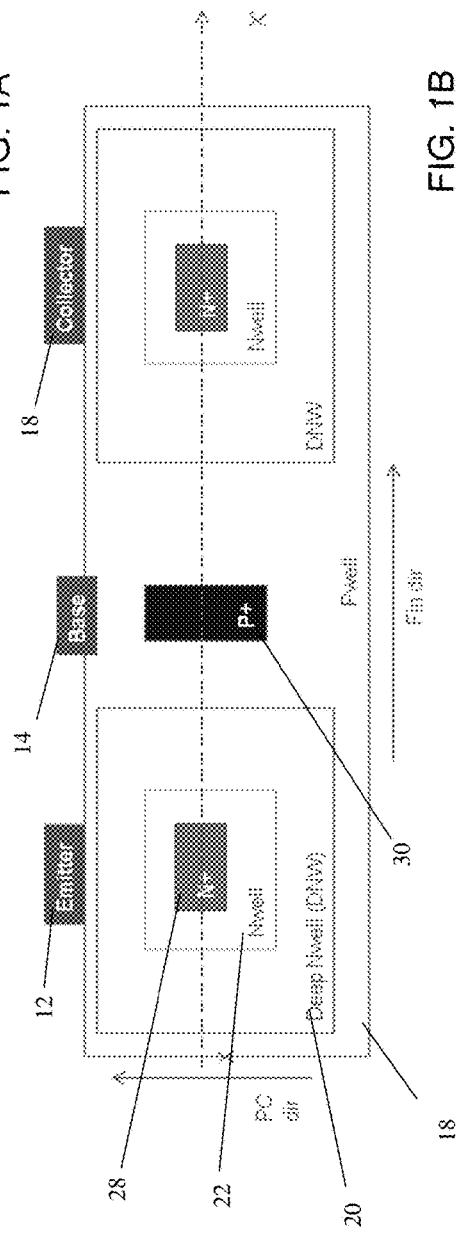

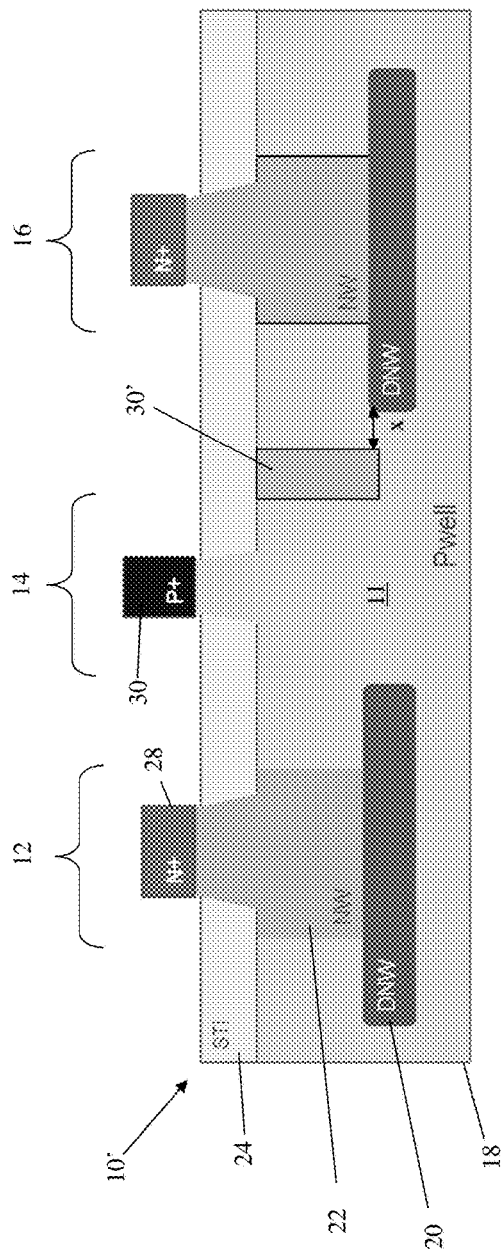
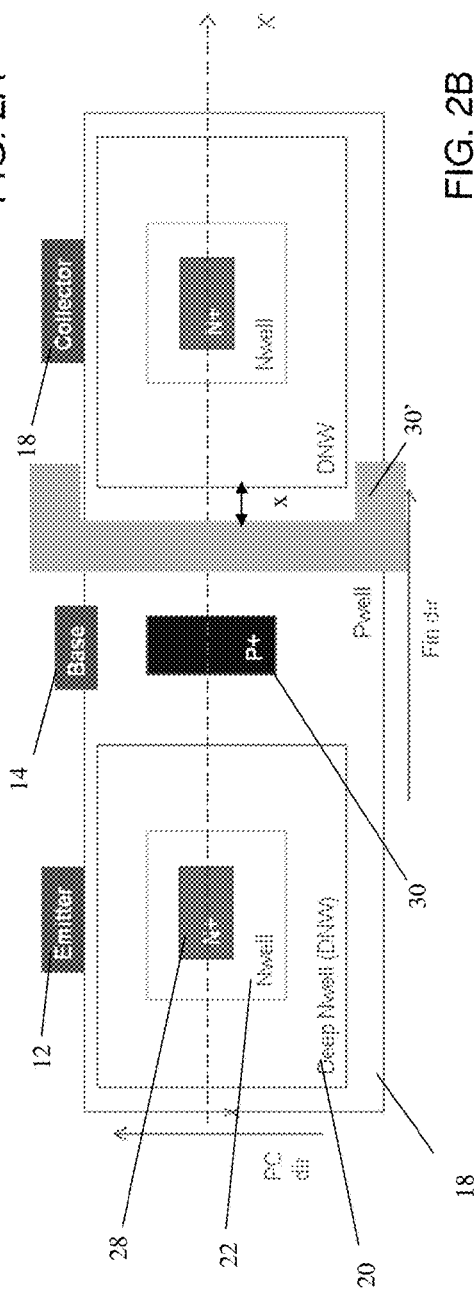
FIG. 2A
FIG. 2B

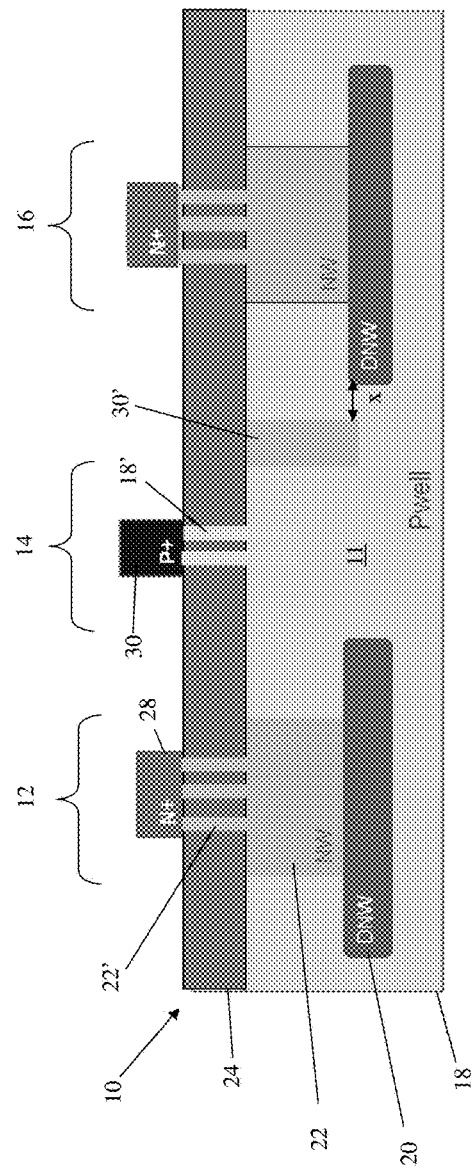
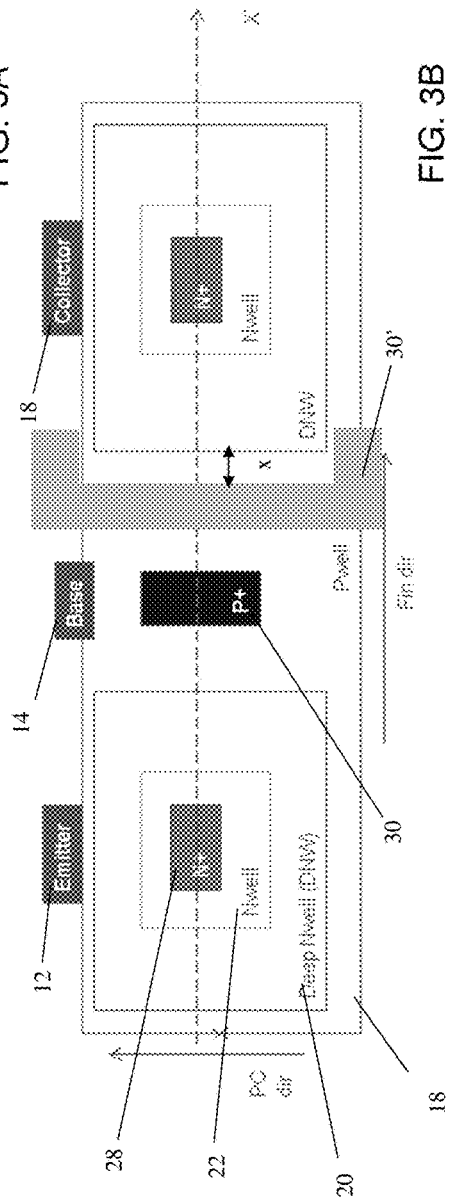
FIG. 3A
FIG. 3B

… (1)

HIGH-VOLTAGE AND ANALOG BIPOLAR DEVICES

FIELD OF THE INVENTION

The present disclosure relates to semiconductor structures and, more particularly, to high-voltage, analog bipolar devices and methods of manufacture.

BACKGROUND

A bipolar junction transistor (bipolar transistor or BJT) is a type of transistor that uses both electron and hole charge carriers. BJTs are manufactured in two types, NPN and PNP, and can be fabricated in integrated circuits. In operation, BJTs use two junctions between two semiconductor types: n-type and p-type.

The basic function of a BJT is to amplify current, which allows the BJT to be used as amplifiers or switches thus giving them wide applicability in electronic equipment including computers, televisions, mobile phones, audio amplifiers, industrial control, and radio transmitters. NPN BJTs also have wide range of applications in areas such as audio, linear and switching, high-voltage, and ESD device/circuits. One of the key objectives of high-voltage NPN transistors is for audio and low noise amplifiers. However, for a given base width, there is always a tradeoff between beta (e.g., collector current/base current) vs. BVCEO (breakdown between collector emitter with base open), as their product is usually a constant value.

SUMMARY

In an aspect of the disclosure, a structure comprises: a base region formed in a substrate; a collector region comprising a deep n-well region and an n-well region formed in the substrate; and an emitter region comprising a deep n-well region and an n-well region formed in the substrate.

In an aspect of the disclosure, a structure comprises: a base region formed in a p-well; a collector region comprising a deep n-well region in direct electrical contact with an n-well region, the deep n-well region and the n-well region of the collector region being formed in the p-well; an emitter region comprising a deep n-well region in direct electrical contact an n-well region, the deep n-well region and the n-well region of the emitter region being formed in the p-well; and a shallow trench isolation region isolating portions of the collector region, the emitter region and the base region.

In an aspect of the disclosure, a method, comprises: forming a base region in a p-well; forming a collector region comprising a deep n-well region and an n-well region in the p-well; and forming an emitter region comprising a deep n-well region and an n-well region in the p-well.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1A shows a cross-sectional view of a deep n-well NPN device and respective fabrication processes in accordance with aspects of the present disclosure.

FIG. 1B shows a top view of the deep n-well NPN device of FIG. 1A, in accordance with aspects of the present disclosure.

FIG. 2A shows a deep n-well NPN device and respective fabrication processes in accordance with another aspect of the present disclosure.

FIG. 2B shows a top view of the deep n-well NPN device of FIG. 2A, in accordance with aspects of the present disclosure.

FIG. 3A shows a deep n-well NPN device and respective fabrication processes in accordance with an additional aspect of the present disclosure.

FIG. 3B shows a top view of the deep n-well NPN device of FIG. 3A, in accordance with an additional aspect of the present disclosure.

DETAILED DESCRIPTION

Figure 4:
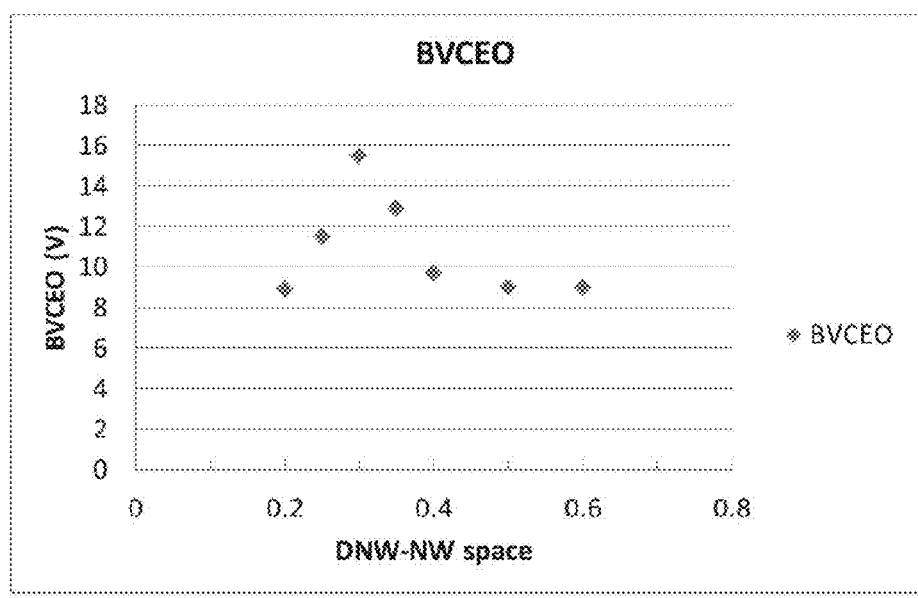
FIG. 4 shows a graph of BVCEO voltage (V) over space between the deep n-well region and n-well region, in accordance with aspect of the present disclosure.

The present disclosure relates to semiconductor structures and, more particularly, to high-voltage, analog bipolar devices and methods of manufacture. More specifically, the present disclosure provides a high-voltage NPN device, which enables higher beta and BVCEO with a low noise architecture (compared to conventional NPN devices). Advantageously, the high-voltage NPN device can be implemented with any deep n-well layer platform including, e.g., 28 nm and beyond technologies. In addition, implementations of the high-voltage NPN device will add no additional cost or processing steps compared with conventional NPN devices.

In specific embodiments, the high-voltage NPN device is a multi-beta and multi BVCEO transistor, which can be tailored to a customer's design performance needs. For example, the device can be implemented for electrostatic discharge (ESD) applications as it has the capability to sink large ESD event current directly to a substrate. The NPN device described herein also offers significantly improved performance parameters, without use of any new mask and processing step, compared to conventional NPN devices. For example, the NPN device described herein uses substrate properties, which has low 1/f noise compared to any surface oriented devices. Also, in further implementations, the use of an n-well bar, for example, can provide higher beta and BVCEO at the same time, which is rare for any given bipolar technology. And, the layout parameters described herein can be used to change the performance values, e.g., beta and BVCEO.

The NPN device of the present disclosure can be manufactured in a number of ways using a number of different tools. In general, though, the methodologies and tools are used to form structures with dimensions in the micrometer and nanometer scale. The methodologies, i.e., technologies, employed to manufacture the NPN device of the present disclosure have been adopted from integrated circuit (IC) technology. For example, the structures are built on wafers and are realized in films of material patterned by photolithographic processes on the top of a wafer. In particular, the fabrication of the NPN device uses three basic building blocks: (i) deposition of thin films of material on a substrate, (ii) applying a patterned mask on top of the films by photolithographic imaging, and (iii) etching the films selectively to the mask.

FIG. 1A shows a cross-sectional view of a deep n-well NPN device in accordance with aspects of the present disclosure. FIG. 1B shows a top view of the deep n-well NPN device of FIG. 1A. In embodiments, the deep n-well NPN device shown in FIGS. 1A and 1B can be a finFET device implemented with replacement metal gate fabrication processes.

Referring to both FIGS. 1A and 1B, the NPN device 10 includes an emitter region 12, a base region 14 and a collector region 16 formed in a p-well region 18. In embodiments, the p-well region 18 can be a boron doped substrate material 11 formed by any appropriate ion implantation or diffusion processes known to those of ordinary skill in the art. In embodiments, the doping concentration of the p-well region 18 can range from about −5e+20 to about −4e+14, depending on its depth and desired performed characteristics. In embodiments, the substrate material 11 can be any appropriate semiconductor material, e.g., Si, SiGe, SiGeC, SiC, GaAs, InAs, InP, and other IIIV or II/VI compound semiconductors.

Still referring to FIGS. 1A and 1B, the emitter region 12 and the collector region 16 both include a deep n-well region 20 and an n-well region 22. The deep n-well junction to substrate side will enhance device 1/f noise and ESD performance in context of self heating. In embodiments, the deep n-well region 20 is formed approximately 1.0 to 2.5 microns below the surface of the substrate 11; although other dimensions are also contemplated herein. The deep n-well region 20 can be formed by any conventional ion implantation process using n-type dopants, e.g., phosphorous or arsenic. In embodiments, the doping concentration of the deep n-well region 20 can range from about 3e+11 to about 7e+17, depending on its depth and the desired performance characteristics.

The n-well region 22 for both the emitter region 12 and the collector region 16 is formed in direct electrical contact with the deep n-well region 20, extending to a surface of the substrate material 11 (i.e., a surface of a shallow trench isolation region 24). In embodiments, the n-well region 22 can also be formed by an ion implantation process, e.g., with a doping concentration of about 5e+13 to about 8.5e+17 depending on its depth and the desired performance characteristics. The n-well regions 22 can be formed in a single masking step.

In embodiments, a shallow trench isolation region 24 is formed in the substrate material 11 to electrically isolate portions of the emitter region 12, base region 14 and collector region 16. More specifically, the shallow trench isolation region 24 electrically isolates the n-well regions 22 of the emitter region 12 and the collector region 16 and the p-well of the base region 14. In embodiments, although the shallow trench isolation region 24 can be formed prior to or after the implantation processes, it is preferably formed prior to the implantation processes. The shallow trench isolation region 24 can be formed by conventional lithography, etching and deposition processes. For example, a resist formed over the substrate material 11 is exposed to energy (light) to form a pattern (opening). An etching process with a selective chemistry, e.g., reactive ion etching (RIE), will be used to form one or more trenches in the substrate material 11 through the openings of the resist. The resist can then be removed by a conventional oxygen ashing process or other known stripants. Following the resist removal, the insulator material (e.g., oxide) can be deposited by any conventional deposition processes, e.g., chemical vapor deposition (CVD) processes. Any residual insulator material on the surface of the substrate material 11 can be removed by conventional chemical mechanical polishing (CMP) processes.

Still referring to FIGS. 1A and 1B, the emitter region 12 and the collector region 16 both include an N+ contact region 28 formed in direct electrical contact with the n-well, e.g., n-well region 22. The base region 14, on the other hand, includes a P+ contact region 2Q formed in direct electrical contact with the p-well 18. The N+ contact region 28 can be a phosphorous or arsenic doped material; whereas, the P+ contact region 30 can be a boron doped material. In embodiments, the N+ contact region 28 and the P+ contact region 30 can be formed by conventional deposition processes (e.g., CVD) followed by lithography and patterning steps, e.g., e.g., reactive ion etching (RIE).

In embodiments, the contact regions 28 and 30 can be, e.g., TiN material, which undergo a silicide process. For example, as should be understood by those of skill in the art, the silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source, drain) forming a low-resistance transition metal silicide. Following the reaction, any remaining transition metal is removed by chemical etching, leaving silicide based contacts. It should be understood by those of skill in the art that silicide contacts will not be required on the devices, when a gate structure is composed of a metal material.

FIG. 2A shows a cross-sectional view of a deep n-well NPN device in accordance with additional aspects of the present disclosure; whereas, FIG. 2B shows a top view of the deep n-well NPN device of FIG. 2A. In addition to the structural features shown in FIGS. 1A and 1B, the deep n-well NPN device 10' of FIGS. 2A and 2B includes an n-well 30' which partly or completely surrounds the collector region 16. In embodiments, the n-well 30' provides improved device performance, e.g., improved beta and increase of the breakdown voltage of the device.

In embodiments, the n-well 30 can be formed by an ion implantation process using the same mask as the n-well region 22, prior to or after the formation of the shallow trench isolation region 24. For example, in embodiments, the n n-well 30' can be ion implanted with phosphorus at a certain energy level resulting in a depth of about 1.2 to 1.3 microns; although other depths are contemplated depending on the depth of the deep n-well region 22. In preferred exemplary embodiments, the n-well 30' should overlap with a depth of the deep n-well region 22. The distance "x" between the edges of the deep n-well region 20 and the n-well 30' can be modified depending on the desired device characteristics, e.g., beat and breakdown voltage. For example, in embodiments, the distance "x" can be about 0.05 microns to about 2 microns.

FIG. 3A shows a cross-sectional view of a deep n-well NPN device in accordance with an additional aspect of the present disclosure; whereas, FIG. 3B shows a top view of the deep n-well NPN device of FIG. 3A. In FIGS. 3A and 3B, the device 10" includes an n-well region 22' and p-well region 18' composed of a plurality of isolated segments within the shallow trench isolation region 24 and in direct electrical contact with the respective contacts 16, 28 and wells, e.g., n-well 22 and p-well 18. In embodiments, the isolated segments of the n-well region 22' are segmented regions electrically isolated by portions of the shallow trench isolation region 24, which can be formed with the same mask and implantation processes as n-well region 22. For example, any fin pitch can be used for any particularly desired technology, e.g., a 48 nm pitch for 14 nm technology.

Similarly, the isolated segmented p-well region 18' can be segmented regions electrically isolated by portions of the shallow trench isolation region 24 and formed with the same mask and implantation processes as the p-well 18. In embodiments, the spacing between the segmented regions can be based on any fin pitch for any particularly desired technology, e.g., a 48 nm pitch for 14 nm technology. And, similar to that shown in FIGS. 2A and 2B, the device 10″ of FIGS. 3A and 3B includes the n-well 30' which partly or completely surrounds the collector region 16.

FIG. 4 shows a graph of BVCEO voltage (V) vs. space between the deep n-well region and n-well region in accordance with aspects of the present disclosure. In embodiments, the space is representative of distance "x" between the edges of the deep n-well region 20 and the n-well 30'. As shown in the graph of FIG. 4, at a space of about 0.3 μm there is a BVCEO of 15.5 V. This is compared to a BVCEO voltage of about 9 V with the use of a deep well implant.

Figure 5:
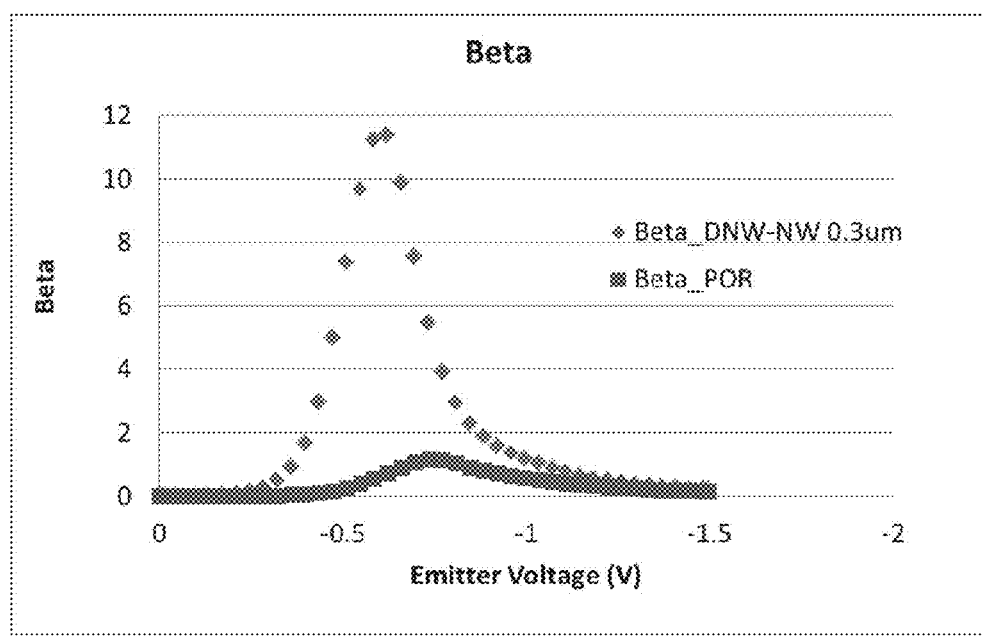
FIG. 5 shows a graph of beta over emitter voltage, comparing the bipolar junction transistor with a deep n-well region compared to a process of record bipolar junction transistor.

FIG. 5 shows a graph of beta vs. emitter voltage, comparing the bipolar junction transistor with a deep n-well region (described herein) to a process of record (POR) bipolar junction transistor (i.e., a bipolar junction transistor without a deep n-well region). As shown in FIG. 5, for a space of about 0.3 μm there is a beta which is significantly higher than the process of record (POR) bipolar junction transistor. For example, at a space of about 0.3 μm and a voltage of about −0.5, the beta of the bipolar junction transistor with deep n-well region (described herein) is about 12, compared to about 1 for the process of record (POR) bipolar junction transistor.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a base region formed in a substrate;
   a collector region comprising a deep n-well region and an n-well region formed in the substrate; and
   an emitter region comprising a deep n-well region and an n-well region formed in the substrate,
   wherein the n-well region of the collector region and the n-well region of the emitter region are each in direct electrical contact with the deep n-well region of the collector region and the deep n-well region of the emitter region, respectively.

2. The structure of claim 1, wherein the base region, the collector region, and emitter region are formed in a p-well.

3. The structure of claim 1, wherein the deep n-well region of the collector region and the deep n-well region of the emitter region are approximately 1.0 to 2.5 microns below a surface of the substrate.

4. The structure of claim 1, further comprising an n-well which partly or completely surrounds the collector region.

5. The structure of claim 4, wherein the n-well has a depth into the substrate which overlaps with a depth of the deep n-well region of the collector region.

6. The structure of claim 5, wherein the n-well and the deep n-well region of the collector region are separated by a distance "x".

7. The structure of claim 1, wherein a junction between the deep n-well region of the collector region and the emitter region and the substrate improve device 1/f noise and electrostatic discharge (ESD) performance in context of self heating.

8. The structure of claim 1, further comprising a shallow trench isolation region isolating portions of the collector region, the emitter region and the base region.

9. The structure of claim 8, wherein the n-well region of the collector region and the n-well region of the emitter region extend to a surface of the shallow trench isolation region and are in contact with respective n+ contacts.

10. The structure of claim 9, wherein the n-well region of the collector region and the n-well region of the emitter region extending to the surface of the shallow trench isolation region are segmented regions electrically isolated by portions of the shallow trench isolation region.

11. The structure of claim 10, wherein a p-well region of the base region extends to the surface of the shallow trench isolation region and comprise segmented portions electrically isolated by portions of the shallow trench isolation region.

12. A structure, comprising:
    a base region formed in a p-well;
    a collector region comprising a deep n-well region in direct electrical contact with an n-well region, the deep n-well region and the n-well region of the collector region being formed in the p-well;
    an emitter region comprising a deep n-well region in direct electrical contact an n-well region, the deep n-well region and the n-well region of the emitter region being formed in the p-well; and
    a shallow trench isolation region isolating portions of the collector region, the emitter region and the base region.

13. The structure of claim 12, wherein the deep n-well region of the collector region and the deep n-well region of the emitter region are approximately 1.0 to 2.5 microns deep.

14. The structure of claim 12, further comprising an n-well formed in the p-well and which partly or completely surrounds the collector region.

15. The structure of claim 14, wherein the n-well has a depth which overlaps with a depth of the deep n-well region of the collector region and is separated by a distance "x" from the deep n-well region of the collector region.

16. The structure of claim 12, wherein the n-well region of the collector region and the n-well region of the emitter region extend to a surface of the shallow trench isolation region and are in contact with respect n+ contacts.

17. The structure of claim 16, wherein:
the n-well region of the collector region and the n-well region of the emitter region extending to the surface of the shallow trench isolation region are segmented regions electrically isolated by portions of the shallow trench isolation region; and
the p-well region of the base region extends to the surface of the shallow trench isolation region and comprise segmented portions electrically isolated by portions of the shallow trench isolation region.

18. A method, comprising:
forming a base region in a p-well;
forming a collector region comprising a deep n-well region and an n-well region in the p-well;
forming an emitter region comprising a deep n-well region and an n-well region in the p-well; and
forming an n-well in the p-well and which partly or completely surrounds the collector region, wherein the n-well has a depth which overlaps with a depth of the deep n-well region of the collector region and is separated by a distance "x" from the deep n-well region of the collector region.

* * * * *